(12) United States Patent
Lakus-Becker et al.

(10) Patent No.: US 8,594,196 B2
(45) Date of Patent: Nov. 26, 2013

(54) SPATIAL WYNER ZIV CODING

(75) Inventors: Axel Lakus-Becker, Artarmon (AU);
Ka-Ming Leung, Marsfield (AU)

(73) Assignee: Canon Kabushiki Kaisha, Tokyo (JP)

( * ) Notice: Subject to any disclaimer, the term of this patent is extended or adjusted under 35 U.S.C. 154(b) by 723 days.

(21) Appl. No.: 12/673,019

(22) PCT Filed: Aug. 29, 2008

(86) PCT No.: PCT/AU2008/001289
§ 371 (c)(1),
(2), (4) Date: Apr. 27, 2010

(87) PCT Pub. No.: WO2009/026656
PCT Pub. Date: Mar. 5, 2009

(65) Prior Publication Data
US 2010/0232500 A1   Sep. 16, 2010

(30) Foreign Application Priority Data

Aug. 30, 2007  (AU) ............................... 2007214319

(51) Int. Cl.
*H04N 7/26* (2006.01)
*H04N 7/32* (2006.01)

(52) U.S. Cl.
USPC ............................... 375/240.12; 375/240.01

(58) Field of Classification Search
USPC ....................................................... 375/240
See application file for complete search history.

(56) References Cited

U.S. PATENT DOCUMENTS

| | | | |
|---|---|---|---|
| 5,995,670 A * | 11/1999 | Zabinsky | 382/242 |
| 6,002,794 A * | 12/1999 | Bonneau et al. | 382/166 |
| 6,252,989 B1 * | 6/2001 | Geisler et al. | 382/232 |
| 6,456,208 B1 * | 9/2002 | Nazari et al. | 341/59 |
| 6,545,615 B2 * | 4/2003 | Kahlman et al. | 341/59 |
| 6,876,315 B1 * | 4/2005 | Widmer | 341/58 |
| 7,436,332 B2 | 10/2008 | Lakus-Becker | 341/59 |
| 8,031,793 B2 * | 10/2011 | Ionescu et al. | 375/267 |
| 8,379,716 B2 * | 2/2013 | Garudadri et al. | 375/240.12 |

(Continued)

FOREIGN PATENT DOCUMENTS

| AU | 2006204634 | * | 8/2006 |
|---|---|---|---|
| AU | 2006204634 A1 | | 8/2006 |

OTHER PUBLICATIONS

Wyner-Ziv Coding of Motion Video (Aaron, A. et al.) May 2006 pp. 1188-1191.*

(Continued)

*Primary Examiner* — Christopher S Kelley
*Assistant Examiner* — Asmamaw G Tarko
(74) *Attorney, Agent, or Firm* — Fitzpatrick, Cella, Harper & Scinto

(57) ABSTRACT

A method of encoding video data generates a first source of video data from a first set of video frames by approximating the first set of video frames. A second source of video data is generated from a second set of video frames by transforming first respective binary representations of pixel values of said second set of video frames into second respective binary representation of the pixel values of the second set of video frames. The video data sources are encoded independently according to a mapping wherein Hamming distance between each of successive pixel values in a predetermined range of values in the second binary representation is greater than Hamming distance between each of successive pixel values in a predetermined range of values in the first binary representation.

12 Claims, 7 Drawing Sheets

(56) References Cited

U.S. PATENT DOCUMENTS

| | | | |
|---|---|---|---|
| 8,391,370 B1* | 3/2013 | Mukherjee et al. | 375/240.24 |
| 2004/0001544 A1* | 1/2004 | Mehrotra | 375/240.1 |
| 2006/0159195 A1* | 7/2006 | Ionescu et al. | 375/267 |
| 2006/0209950 A1* | 9/2006 | Zhu | 375/240.03 |
| 2008/0055124 A1 | 3/2008 | Lakus-Becker | 341/81 |
| 2008/0079612 A1* | 4/2008 | Lu et al. | 341/50 |
| 2009/0003452 A1* | 1/2009 | Au et al. | 375/240.17 |
| 2009/0031191 A1* | 1/2009 | Yang et al. | 714/758 |
| 2009/0074077 A1 | 3/2009 | Lakus-Becker | 375/240.25 |
| 2010/0008589 A1* | 1/2010 | Bober et al. | 382/218 |
| 2010/0034290 A1 | 2/2010 | Lakus-Becker | 375/240.25 |
| 2010/0183231 A1* | 7/2010 | Brasnett et al. | 382/209 |
| 2010/0208801 A1* | 8/2010 | Yamasaki | 375/240.12 |
| 2010/0220787 A1* | 9/2010 | Yamasaki | 375/240.16 |
| 2010/0303279 A1* | 12/2010 | Tian et al. | 382/100 |

OTHER PUBLICATIONS

Aaron, A., et al., "Wyner-Ziv Coding of Motion Video", Electrical and Computer Engineering 2006, CCECE '06, Canadian Conference, May 2006, pp. 1188-1191.

International Search Report and Written Opinion of the International Searching Authority, PCT/AU2008/001289, Oct. 10, 2008.

* cited by examiner

| 3-bit unsigned integer | | | |
| --- | --- | --- | --- |
| Integer | Bit Pattern 1 | Bit Pattern 2 | Bit Pattern 3 |
| 0 | 101 | 000 | 011 |
| 1 | 000 | 111 | 100 |
| 2 | 011 | 001 | 010 |
| 3 | 110 | 110 | 101 |
| 4 | 001 | 011 | 110 |
| 5 | 010 | 100 | 001 |
| 6 | 100 | 010 | 111 |
| 7 | 111 | 101 | 000 |

Fig. 7A

| 4-bit unsigned integer | | | |
| --- | --- | --- | --- |
| Integer | Bit Pattern 1 | Bit Pattern 2 | Bit Pattern 3 |
| 0 | 1101 | 0000 | 1111 |
| 1 | 0000 | 1110 | 0010 |
| 2 | 1110 | 0101 | 1001 |
| 3 | 0101 | 1011 | 0111 |
| 4 | 1011 | 0110 | 1010 |
| 5 | 1100 | 1101 | 0100 |
| 6 | 0001 | 0011 | 0011 |
| 7 | 0110 | 1000 | 1000 |
| 8 | 1000 | 1111 | 0110 |
| 9 | 0011 | 0001 | 0001 |
| 10 | 0100 | 1100 | 1100 |
| 11 | 1010 | 0111 | 1011 |
| 12 | 0111 | 1010 | 0101 |
| 13 | 1001 | 0100 | 1110 |
| 14 | 0010 | 1001 | 0000 |
| 15 | 1111 | 0010 | 1101 |

Fig. 7B

SPATIAL WYNER ZIV CODING

TECHNICAL FIELD

The present invention relates generally to video encoding and decoding and, in particular, to means of improving Wyner Ziv decoding.

BACKGROUND

Various products, such as digital cameras and digital video cameras, are used to capture images and video. These products contain an image sensing device, such as a charge coupled device (CCD), which is used to capture light energy focussed on the image sensing device. The captured light energy, which is indicative of a scene, is then processed to form a digital image. Various formats are used to represent such digital images, or to videos. Formats used to represent video include Motion JPEG, MPEG2, MPEG4 and H.264.

A common feature of the formats listed above is that they are each compression formats. While those formats offer high quality and improve the number of video frames that can be stored on a given media, they typically suffer because of their long encoding runtime.

A complex encoder requires complex hardware. Complex encoding hardware is disadvantageous in terms of design cost, manufacturing cost and physical size of the encoding hardware. Furthermore, long encoding runtime delays the rate at which video frames can be captured while not overflowing a temporary buffer. Additionally, more complex encoding hardware has higher energy consumption. As longer battery life is highly desirable for a mobile device, it is that desirable that battery energy consumption be minimized in mobile devices.

To minimize the complexity of the encoder, Wyner Ziv coding, or "distributed video coding", may be used. In distributed video coding the complexity of the encoder is shifted to the decoder. In distributed video coding the input video stream is usually split into key frames and non-key frames. The key frames are compressed using a conventional coding scheme, such as Motion JPEG, MPEG2, MPEG4 or H.264, and the decoder operates to conventionally decode the key frames. With the help of the decoded key frames, the non-key frames are predicted. The processing at the decoder is thus equivalent to carrying out motion estimation which is usually performed at the encoder. The predicted non-key frames are improved in terms of visual quality with the information the to encoder provides for the non-key frames.

The visual quality of the decoded video stream depends heavily on the quality of the prediction of the non-key frames and the level of quantization to the image pixel values. The prediction is often a rough estimate of the original frame, generated from adjacent frames, for example through motion estimation and interpolation. When there is a mismatch between the prediction and the decoded values, some form of compromise is required to resolve the differences.

The objective of distributed video coding is to correct both prediction errors and error correction errors. Some prior art address this objective by employing a frame re-construction function after performing Wyner-Ziv decoding. If the predicted value is within range of the decoded quantized symbol, the reconstructed pixel value is made equal to the predicted value, otherwise the re-construction value is set equal to the upper bound or the lower bound of the quantized symbol, depending on the magnitude of the predicted value. This approach has the advantage of minimizing decoding errors and eliminates large positive or negative errors which are highly perceptible to human senses. However, such an approach is considered to be sub-optimal.

SUMMARY

It is an object of the present invention to substantially overcome, or at least ameliorate, one or more disadvantages of existing arrangements.

According to an aspect of the present invention, there is provided a method of encoding video data, said method comprising the steps of:

generating a first source of video data from a first set of video frames by approximating said video frames;

generating a second source of video data from a second set of video frames by modifying respective binary representations of pixel values of said second set of video frames according to a mapping such that at least successive pixel values in a predetermined range of values in the modified binary representation have binary representations with improved Hamming distances; and encoding said first and second sources independently.

According to another aspect of the present invention, there is provided a method of decoding encoded video data from a first and a second source of video data, said first source of video data comprising a first approximation of a first set of video frames and said second source of video data being formed by applying a mapping on pixel values of a second set of video frames, said mapping modifying respective binary representations of pixel values in a predetermined range of values such that at least successive pixel values in the mapped binary representation have binary representations with improved Hamming distances, said method comprising the steps of:

generating a second approximation of at least said first set of video frames from said first source of video data;

modifying binary representations of pixel values of at least a portion of said second approximation using said mapping;

correcting the modified binary representations of pixel values of said second approximation using said second source of video data and the Hamming distances between the modified binary representations of pixel values of said second approximation and corrected binary representations; and applying the inverse of said mapping to corrected binary representations.

According to another aspect of the present invention, there is provided a method of encoding and decoding video data, said method comprising the steps of:

generating a first source of video data from a first set of video frames by approximating said video frames;

generating a second source of video data from a second set of video frames by modifying respective binary representations of pixel values of said second set of video frames according to a mapping such that at least successive pixel values in a predetermined range of values in the modified binary representation have binary representations with improved Hamming distances;

generating an approximation of at least said first set of video frames from said first source of video data;

modifying binary representations of pixel values of at least a portion of said approximation using said mapping;

correcting the modified binary representations of pixel values of said approximation using said second source of video data and the Hamming distances between modified binary representations of pixel values of said approximation and corrected binary representations; and applying the inverse of said mapping to corrected binary representations.

According to yet another aspect of the present invention, there is provided an apparatus for implementing any one of the aforementioned methods.

According to another aspect of the present invention there is provided a computer program product including a computer readable medium having recorded thereon a computer program for implementing any one of the methods described above.

Other aspects of the invention are also disclosed.

BRIEF DESCRIPTION OF THE DRAWINGS

At least one embodiment of the present invention will now be described with reference to the drawings, in which:

FIGS. 7A and 7B show examples of a bit patterns of a new binary representation used in the system of FIG. 1.

DETAILED DESCRIPTION INCLUDING BEST MODE

Figure 1:
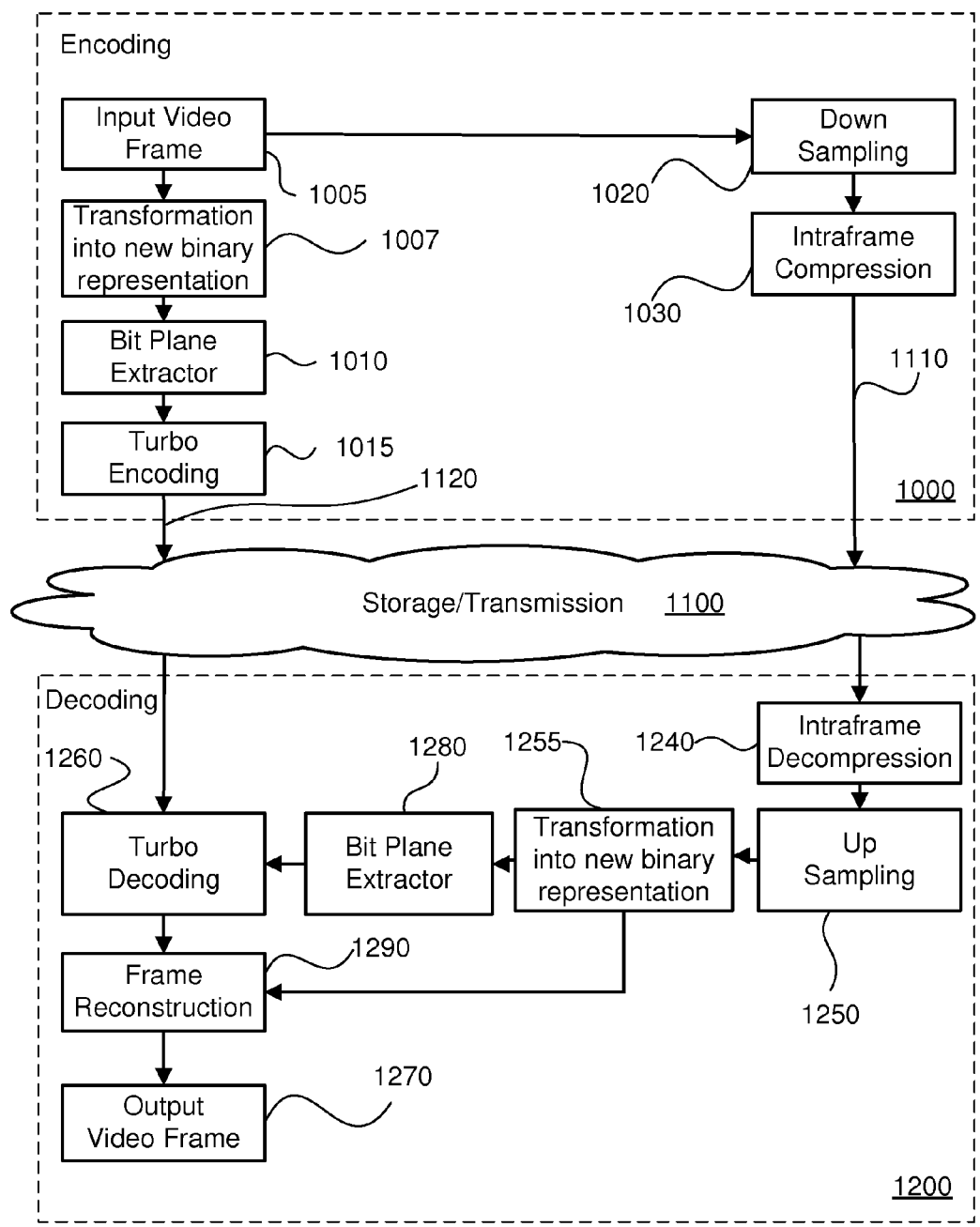
FIG. 1 shows a schematic block diagram of a system for encoding an input video, a system for transmitting or storing the encoded video, and a system for decoding the to video.

Where reference is made in any one or more of the accompanying drawings to steps and/or features, which have the same reference numerals, those steps and/or features have for the purposes of this description the same function(s) or operation(s), unless the contrary intention appears.

FIG. 1 shows a schematic block diagram of a system 100 including a system for encoding an input video, a system for transmitting or storing the encoded video and a system for decoding the video. The system 100 includes an encoder 1000 and a decoder 1200 interconnected through a storage or transmission medium 1100. The encoder 1000 forms two independently encoded bit streams 1110 and 1120, which are jointly decoded by the decoder 1200.

Figure 4:
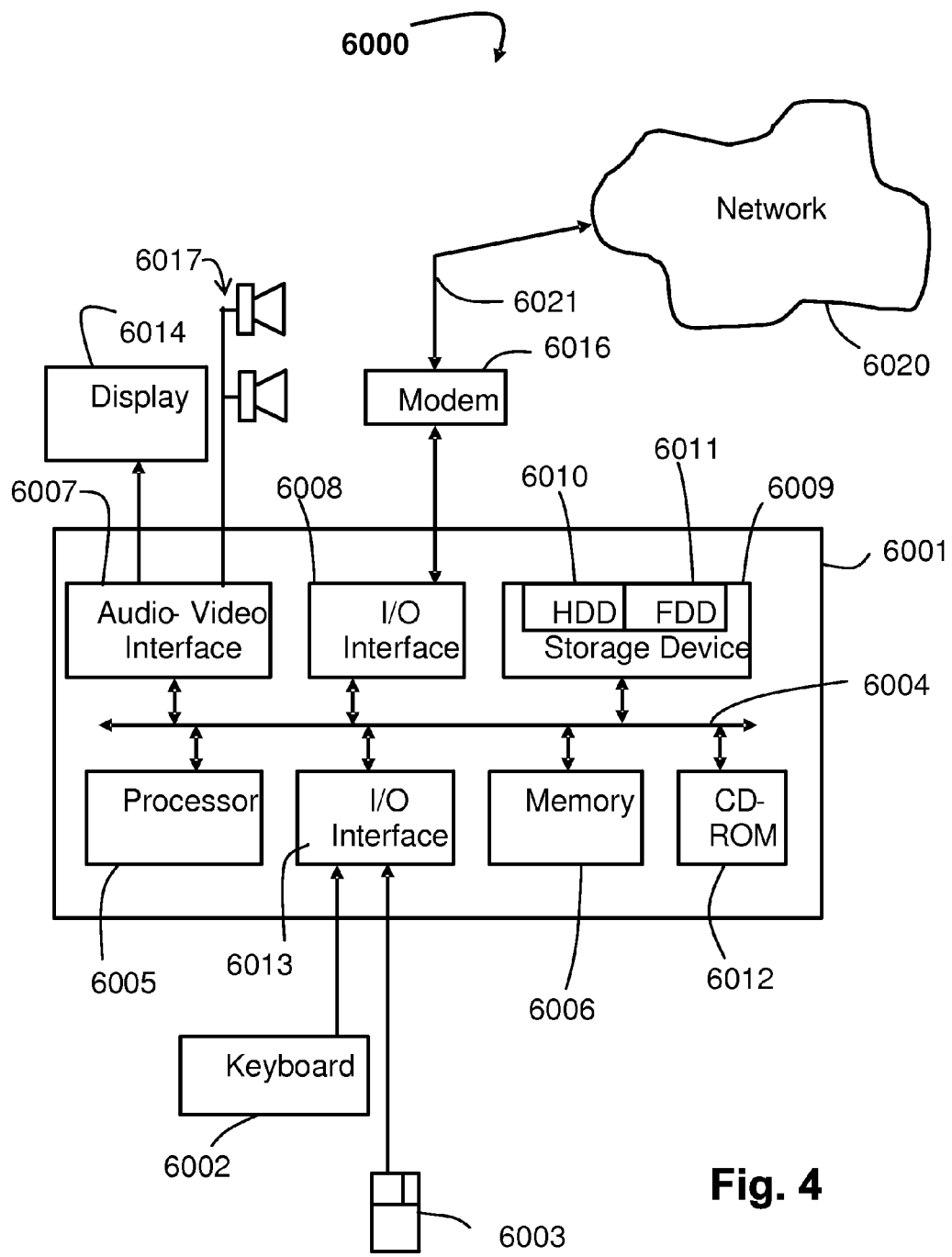
FIG. 4 shows a schematic block diagram of a computer system in which the systems shown in FIG. 1 may be implemented.

The components 1000, 1100 and 1200 of the system 100 shown in FIG. 1 may be implemented using a computer system 6000, such as that shown in FIG. 4, wherein the encoder 1000 and decoder 1200 may be implemented as software, such as one or more application programs executable within the computer system 6000. The software may be stored in a computer readable medium, including the storage devices described below, for example. The software is loaded into the computer system 6000 from the computer readable medium, and then executed by the computer system 6000. A computer readable medium having such software or computer program recorded on it is a computer program product.

As seen in FIG. 4, the computer system 6000 is formed by a computer module 6001, input devices such as a keyboard 6002 and a mouse pointer device 6003, and output devices including a display device 6014 and loudspeakers 6017. An external Modulator-Demodulator (Modem) transceiver device 6016 may be used by the computer module 6001 for communicating to and from a communications network 6020 via a connection 6021.

The computer module 6001 typically includes at least one processor unit 6005, and a memory unit 6006. The module 6001 also includes an number of input/output (I/O) interfaces including an audio-video interface 6007 that couples to the video display 6014 and loudspeakers 6017, an I/O interface 6013 for the keyboard 6002 and mouse 6003, and an interface 6008 for the external modem 6016. In some implementations, the modem 6016 may be incorporated within the computer module 6001, for example within the interface 6008. A storage device 6009 is provided and typically includes a hard disk drive 6010 and a floppy disk drive 6011. A CD-ROM drive 6012 is typically provided as a non-volatile source of data.

The components 6005, to 6013 of the computer module 6001 typically communicate via an interconnected bus 6004 and in a manner which results in a to conventional mode of operation of the computer system 6000 known to those in the relevant art.

Typically, the application programs discussed above are resident on the hard disk drive 6010 and read and controlled in execution by the processor 6005. Intermediate storage of such programs and any data fetched from the network 6020 may be accomplished using the semiconductor memory 6006, possibly in concert with the hard disk drive 6010. In some instances, the application programs may be supplied to the user encoded on one or more CD-ROM and read via the corresponding drive 6012, or alternatively may be read by the user from the network 6020. Still further, the software can also be loaded into the computer system 6000 from other computer readable media. Computer readable media refers to any storage medium that participates in providing instructions and/or data to the computer system 6000 for execution and/or processing.

The system 100 shown in FIG. 1 may alternatively be implemented in dedicated hardware such as one or more integrated circuits. Such dedicated hardware may include graphic processors, digital signal processors, or one or more microprocessors and associated memories.

In one implementation, the encoder 1000 and a decoder 1200 are implemented within a camera (not illustrated), wherein the encoder 1000 and the decoder 1200 may be implemented as software executing in a processor of the camera, or implemented using hardware.

In a second implementation only the encoder 1000 is implemented within a camera, wherein the encoder 1000 may be implemented as software executing in a processor of the camera, or implemented using hardware.

Referring again to FIG. 1, a video frame 1005 is received as input to system 100. Typically the frame 1005 is one of a sequence of frames and is stored in the memory 6006 during the processing to be described. Preferably every input video frame 1005 is processed by the system 100. In such a case, the sequence of frames may be a clip or video sequence (an input video) stored in the HDD 6010 or on a disk medium able to be read by the CD-ROM drive 6012. In an alternative implementation, for example, only every fifth input video frame is encoded using the system 100. In another implementation, a selection of input video frames 1005 for encoding is made from the input video, with the selection of the input video frame 1005 depending on the video content. For example, if an occlusion of an object represented in the input video is observed, and if the extent of the observed occlusion is found to be above a threshold, then the input video frame 1005 is encoded using the system 100.

In the encoder 1000, the input video frame 1005 may be a frame of a first set of video frames and is down sampled by sampler 1020 to form a down sampled version of the input video frame. The down sampled version of the input video frame is then compressed using an intraframe compression module 1030 to form bit stream 1110. When the frames of the first set are so processed, the bit stream 1110 forms an encoded first source of video data approximating the video frames of the first set. The downsampling and compression provide for the bit stream 1110 to be transmitted over, or stored in, the storage or transmission medium 1100 for decompression by the decoder 1200.

In a preferred implementation, a downsampling filter with a cubic kernel is employed by the sampler 1020. A default downsampling rate is two, meaning the resolution is reduced to one half of the original resolution in both the horizontal and vertical dimensions. A different downsampling rate may be defined by a user. Alternative downsampling methods may be employed by sampler 1020, such as the nearest neighbour, bilinear, bi-cubic, and quadratic down sampling filters using various kernels such as Gaussian, Bessel, Hamming, Mitchell or Blackman kernels.

The compression employed by the intraframe compression module 1030 may be baseline mode JPEG compression, compression according to the JPEG2000 standard, or compression according to the H.264 standard.

Independently from the downsampling in the sampler 1020 and the compression in intraframe compression module 1030, parts of the selected input video frame 1005 are used to form the bit stream 1110.

In order to form the second bit stream 1120, the input video frame 1005 is also transformed into a new binary representation in a transformation module 1007. The binary representations are described in more detail below. Again the input frame 1005 may be one of a second set of frames that is transformed or modified to form a second source of video data.

The bit stream resulting from the module 1007 is input to a bit plane extractor 1010 where each block of coefficients is arranged into a bit stream. Preferably, scanning starts in a first pass on the most significant bit plane of the frame 1005 and concatenates the most significant bits of the coefficients of the frame 1005. This forms a bit stream containing the most significant bits. The bit stream may be temporarily stored in the memory 6006. In a second pass, the scanning concatenates the second most significant bits of all coefficients of the frame 1005. The bits from the second scanning path are then appended to the bit stream generated in the previous scanning path, for example within the memory 6006.

The scanning and appending continues in this manner until the least significant bit plane is completed. A single bit stream is thus generated for the input video frame 1005. Most desirably, the scanning follows a raster scanning order wherein each single pixel is processed. In alternative implementations, the scanning path may be similar to the scanning path employed in the JPEG 2000 standard. In yet another alternative implementation, not every pixel is processed. The bit plane extractor 1010 in this regard may be configured to extract a specified subset of pixels within each bit plane to generate a bit stream containing bits for spatial resolutions lower than the original resolution.

The output bit stream from the bit plane extractor 1010, for example stored in the memory 6006, is then encoded in a turbo coder or encoder 1015 to produce a bit stream 1120 containing parity information. In the arrangement of FIG. 1, for each single bit plane in the input video frame 1005, parity bits are produced. Accordingly, if the bit depth of the input video frame 1005 is eight, then eight sets of parity bits are produced of which each single parity bit set refers to one bit plane only. The parity bits output by the turbo encoder 1015 are then transmitted over to a storage or transmission medium 1100 in the bit stream 1120. Again, where the frame 1005 is part of the second set of video frames, the new binary representation may be considered as a generated second source of video data which is encoded by the turbo encoder 1015. As will be apparent from the above and from FIG. 1, the bit streams 1110 and 1120 are each formed by independent encoding of separate sources of video data derived from a common source of all video frames. The first and second sets of video frames further may have common frames, for example where the sets are identical.

Figure 2:
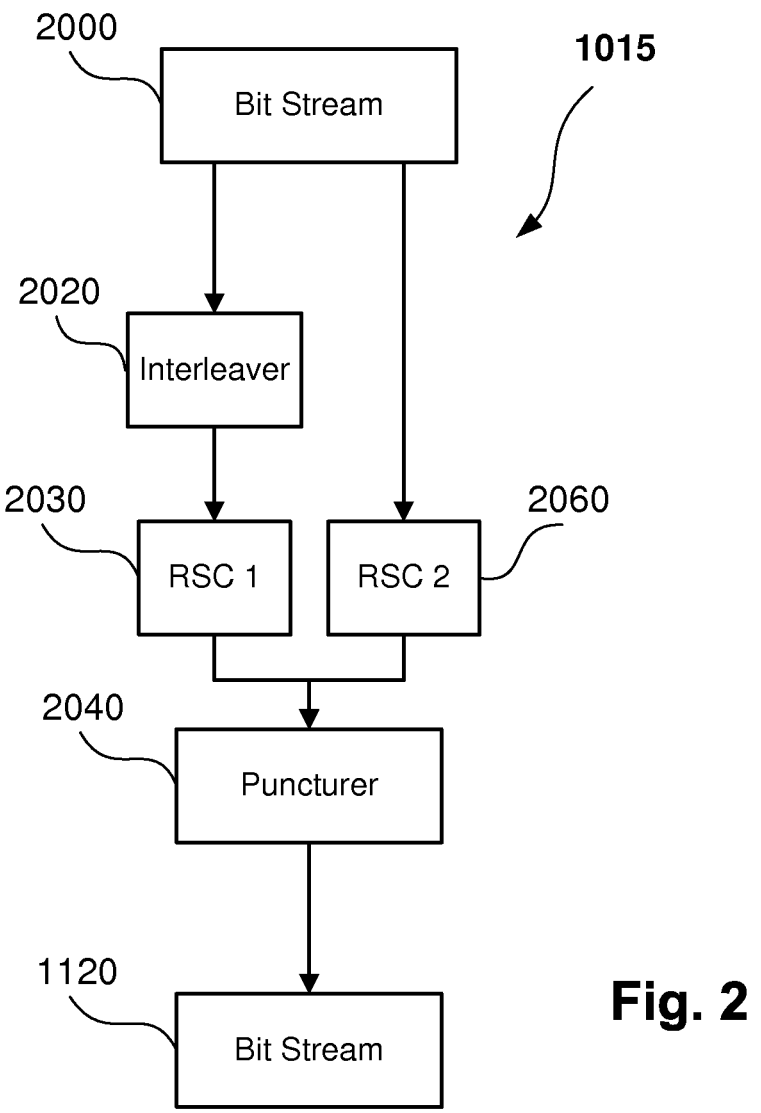
FIG. 2 shows a schematic block diagram of a turbo coder of the systems of FIG. 1.

The operation of the turbo coder 1015 is described in greater detail with reference to FIG. 2.

The encoder 1000 thus forms two bit streams 1110 and 1120, both derived from the same single input video frame 1005. The two bit streams 1110 and 1120 from the intraframe compression module 1030 and turbo coder 1015 respectively may be multiplexed into a single bit stream, which is then stored in, or transmitted over, storage or transmission medium 1100.

The transformation or modifying of the input video frame 1005 into the new binary representation, performed in the transformation module 1007, is now described in more detail. The module 1007 accepts as input a standard binary representation of the unsigned integer representing a pixel or component value of the input video frame. For example, if a bit depth of 3 is used to represent a pixel or component value, then a value 2 is represented as 010, etc. Similarly, if a bit depth of 4 is used to represent a pixel or component value, then a value 8 is represented as 1000, etc. In each case the bit depth represents a predetermined range of values in the modified binary representation.

In the new binary representation formed by the module 1007, two successive values differ by more than one bit. Accordingly, the Hamming distance between two successive values is at least two. FIG. 7A shows three different bit patterns that may be used when the bit depth is 3. In the case of bit pattern 1, integer 0 is mapped to the bit pattern 101, integer 1 is mapped to 000, integer 2 is mapped to 011, and so on. FIG. 7B shows three different bit patterns that may be used when the bit depth is 4. As can be seen by inspecting the bit patterns in FIGS. 7A and 7B, two successive values always differ by more than one bit. Furthermore, the new bit representation is such that if two bit representations differ only in one bit, the associated transformed integer values differ by a significant amount. For example, in the first bit pattern in FIG. 7A the integer value 0 is mapped to (101) and the integer value 1 is mapped to (000). The Hamming distance of the new bit representation is two, and is thus improved in comparison to the original hamming distance. Similarly, again in FIG. 7A, the integer value 2 is mapped to (011) and the integer value 3 is mapped to (110), the Hamming distance of the new bit representation is also two. In contrast, the transformed integer values of 0 and 7 differ by only one (101 and 111 respectively). However, any useful prediction will not mistake the integer value 0 for 7 and vice versa.

These bit patterns of the new binary representation allow the decoder 1200 to distinguish between prediction errors and error correction errors, hence improving the visual quality when re-constructing the output video frame 1270.

In a preferred implementation, only the first four most significant bit planes are transformed to this new binary representation for error corrections and then transmitted to the decoder 1200. In an alternative implementation, all bit planes are transformed into the new binary representation before turbo encoding.

Having described an overview of the operation of the encoder 1000, an overview of the operation of the decoder 1200 is described next. The decoder 1200 receives two inputs; the first input is the bit stream 1120 from or at least formed by the turbo coder 1015, and the second input is the bit stream 1110 from or at least formed by the intraframe compression module 1030.

Bit stream 1110 is processed by an intraframe decompressor 1240 which performs the inverse operation to that of the intraframe compressor 1030, in a manner known in the art. The intraframe decompressor 1240 restores an approximation of the down sampled version of the input video frame 1005.

This approximation of the down sampled version of the input video frame 1005 is then up sampled by a sampler or upsampler 1250. Preferably a cubic filter is used during the upsampling. It is noted that the upsampling method used by sampler 1250 does not have to be the inverse of the down sampling method used by the sampler 1020. For example, a bilinear down sampling and a cubic up sampling may be employed. The output from the sampler 1250 is an estimate of the input video frame 1005. That output from the sampler 1250 is transformed or modified to a new binary representation in transformation module 1255. The module 1255 is identical to the module 1007 of the encoder 1000. The resulting bit stream is then input to a bit plane extractor 1280, which in a preferred implementation is also identical to the bit plane extractor 1010 of the encoder 1000. The output from the bit plane extractor 1280 can be stored in a buffer, not shown in FIG. 1. The buffer may for example be implemented using the memory 6006, for example where the storage 1100 is the HDD 6010, or a memory 6006 of a separate computer module 6001 to that which formed the bit streams 1120 and 1110.

The decoder 1200 further includes a turbo decoder 1260, which is described later in detail with reference to FIG. 3. The turbo decoder 1260 operates on each bit plane in turn to correct at least a portion of the current bit plane. In a first iteration, the turbo decoder 1260 receives as input the parity bits for the first (most significant) bit plane from the bit stream 1120. The turbo decoder 1260 also receives the first bit plane from the bit plane extractor 1280 as side information. The turbo decoder 1260 uses the parity bits for the first bit plane to improve the approximation of the first bit plane of the down sampled version of the input video frame 1005, where the down sampled version is taken from the bit plane extractor 1280, thereby outputting a decoded first bit plane. The above process repeats for lower bit planes until all bit planes are decoded.

A frame reconstruction module 1290, which is described in detail later with reference to FIG. 6, takes the decoded values from the turbo decoder 1260 and the prediction from the sampler 1250 which has been transformed to the new binary representation as input. From those inputs, and exploiting the Hamming distance of the new binary representation, the frame reconstruction module 1290 detects and corrects errors in the decoded values from the turbo decoder 1260. The frame reconstruction module 1290 also reverses the transformation performed by modules 1007 and 1255 by applying the inverse of that transformation to the corrected decoded values. The result is output as an output video frame 1270, which is a final approximation of the input video to frame 1005. The output may be directed to storage, such as the HDD 6010, for local display upon the display device 6014, or for transmission over the network 6020 where desired.

It will be appreciated that the prediction formed by the sampler 1250 may contain errors. Since the parity bits associated with bit stream 1120 relate to a transformed version of the input video frame 1005, the prediction formed by sampler 1250 is also transformed in module 1255. The frame reconstruction module 1290 uses the predicted values to reduce a search range over which the module 1290 operates to recover the original pixel values after transformation. Since successive original pixel values after transformation have a Hamming distance of at least 2, the frame reconstruction module 1290 has an improved likelihood of identifying, and correcting, errors in the prediction. The frame reconstruction module 1290 is described in more detail below.

Having described system 100 for encoding an input video frame 1005 to form two independently encoded bit streams 1110 and 1120, and jointly decoding the bit streams 1110 and 1120 to provide output video frame 1270, components of system 100 are now described in more detail.

The turbo coder 1015 is now described in greater detail with reference to FIG. 2 where a schematic block diagram of the turbo coder 1015 is shown. The turbo coder 1015 receives as input a bit stream 2000 from the bit plane extractor 1010. An interleaver 2020 interleaves the bit stream 2000 (the information bit stream). In a preferred implementation this interleaver 2020 is a block interleaver. However, in alternative implementations, any other interleaver known in the art, for example a random or pseudo-random interleaver, or a circular-shift interleaver, may be used.

The output from the interleaver 2020 is an interleaved bit stream, which is passed on to a recursive systematic coder (RSC) 2030 which produces parity bits. One parity bit to per input bit is produced. In the preferred embodiment the recursive systematic coder 2030 operates using the octal generator polynomials 7 (binary $111_2$) and 5 (binary $101_2$).

A second recursive systematic coder (RSC) 2060 operates directly on the bit stream 2000 received from the bit plane extractor 1010. Desirably, the recursive systematic coders 2030 and 2060 are identical. Each recursive systematic coder 2030 and 2060 outputs a parity bit stream to a puncturer 2040, with each parity bit stream being equal in length to the input bit stream 2000.

The puncturer 2040 deterministically deletes parity bits to reduce the parity bit overhead previously generated by the recursive systematic coders 2030 and 2060. Typically, so-called "half-rate" codes are employed, which means that half the parity bits from each recursive systematic encoder 2030 and 2060 are punctured. In an alternative implementation, operation of the puncturer 2040 may depend on additional information, such as the bit plane of the current information bit. In yet another alternative, operation of the puncturer 2040 may depend on the spatial location of the pixel to which the information bit belongs, as well as the frequency content of the area around this pixel.

The turbo coder 1015 produces as output a punctured parity bit stream 1120, which comprises parity bits produced by recursive systematic coders 2060 and 2030. This concludes the detailed description of the turbo encoder 1015.

The turbo decoder 1260 is now described in detail with reference to FIG. 3 where a schematic block diagram of the turbo decoder 1260 is shown. The parity bits 3000 in bit stream 1120 are split into two sets of parity bits: one set 3020 for the parity bits originating from the recursive systematic coder 2030 (FIG. 2) and one set 3040 of parity bits originating from the recursive systematic coder 2060 (FIG. 2).

Parity Bits 3020 are then input to a Component Decoder 3060, which preferably employs the Soft Output Viterbi Decoder (SOYA) algorithm, known in the art. Alternatively, a Max-Log Maximum A Posteriori Probability (MAP) algorithm, known in the art, may be employed. In yet another alternative, variations of the SOYA or the MAP algorithms may be used.

Systematic bits 3010, received from the bit plane extractor 1280 (FIG. 1) are passed as input to an interleaver 3050. This interleaver 3050 is also linked to output to the component decoder 3060. In a similar manner, the parity bits 3040 are input to a Component Decoder 3070, together with the systematic bits 3010.

Figure 3:
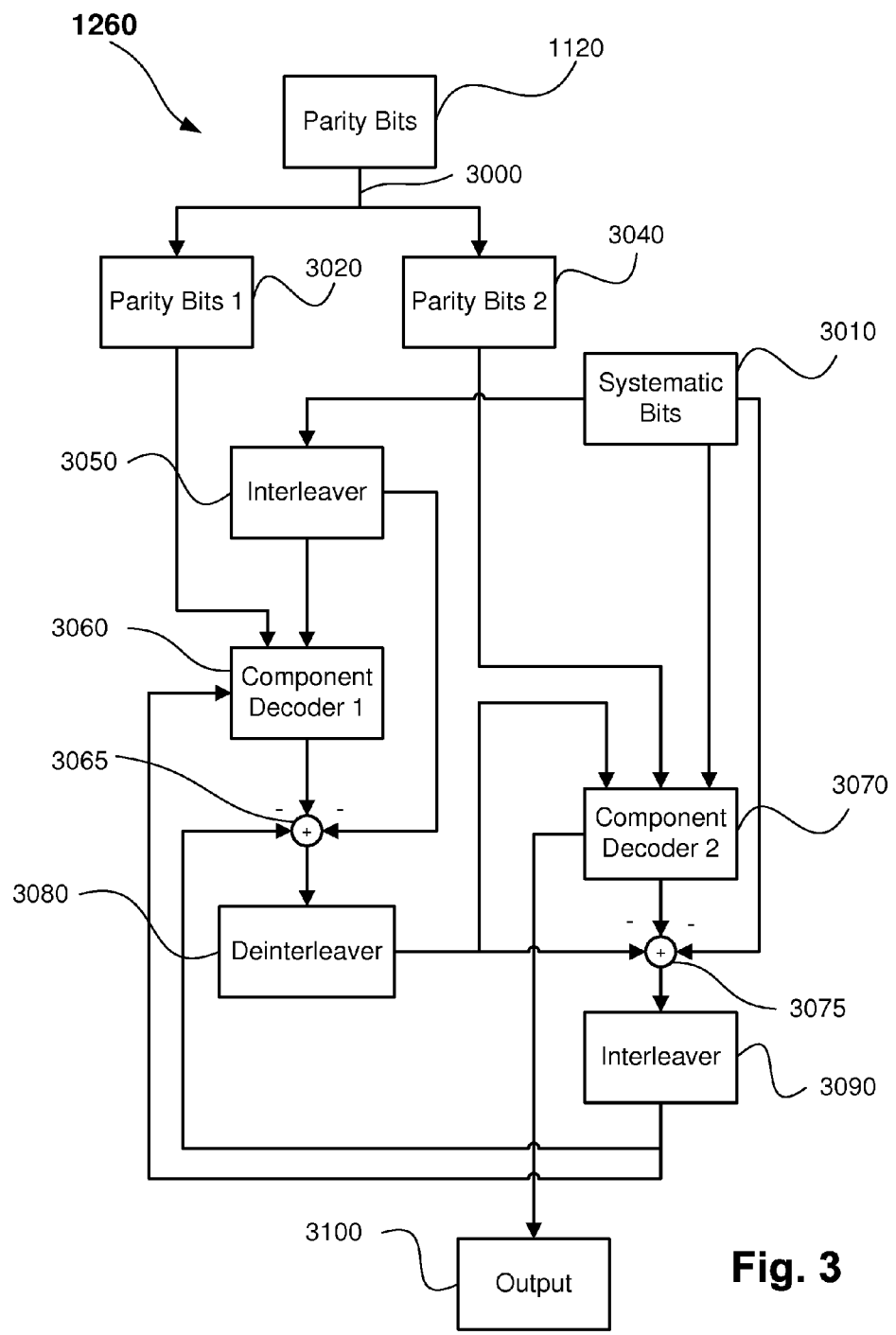
FIG. 3 shows a schematic block diagram of a turbo decoder of the systems of FIG. 1.

As can be seen in FIG. 3, the turbo decoder 1260 works iteratively. A loop is formed starting from the component decoder 3060, to an adder 3065, to a deinterleaver 3080, to the component decoder 3070, to another adder 3075, to another interleaver 3090 and back to the component decoder 3060.

The component decoder 3060 takes three inputs; the parity bits 3020, the interleaved systematic bits from the interleaver 3050, and an output from the second component decoder 3070 which has been modified in the adder 3075 and interleaved in the interleaver 3090. The input from the one component decoder to the other component decoder provides information about the likely values of the bits to be decoded. This information is typically provided in terms of the Log Likelihood Ratios $$L(u_k) = \ln\left(\frac{P(u_k = +1)}{P(u_k = -1)}\right),$$

where $P(u_k=+1)$ denotes the probability that the bit $u_k$ equals +1 and where $P(u_k=-1)$ denotes the probability that the bit $u_k$ equals −1.

In a first iteration, the feedback input from the second component decoder 3070 does not exist. Therefore, in the first iteration the feedback input from the second component decoder 3070 is set to zero.

The (decoded) bit sequence produced by component decoder 3060 is passed on to adder 3065 where the so-called a priori information related to the bit stream is produced: the systematic bits received via the interleaver 3050 are extracted in the adder 3065 and the information produced by the second component decoder 3070 (which are processed analogously in the adder 3075 and interleaved in interleaver 3090) are extracted as well. Left over is the a priori information which gives the likely value of a bit. This information is valuable for the next decoding iteration.

After the adder 3065, the resulting bit stream is de-interleaved in the deinterleaver 3080, which performs the inverse action of interleaver 3050. The de-interleaved bit stream from the deinterleaver 3080 is provided as input to component decoder 3070. In a preferred implementation, the component decoder 3070, as well as adder 3075, works analogously to the component decoder 3060 and the adder 3065 already described. The resulting bit stream is again interleaved in the interleaver 3090 and used as input for the second iteration to the first component decoder 3060.

In a preferred implementation, eight iterations between the first component decoder 3060 and the second component decoder 3070 are carried out. After completion of eight iterations the resulting bit stream produced from component decoder 3070 is provided as an output 3100.

Figure 5:
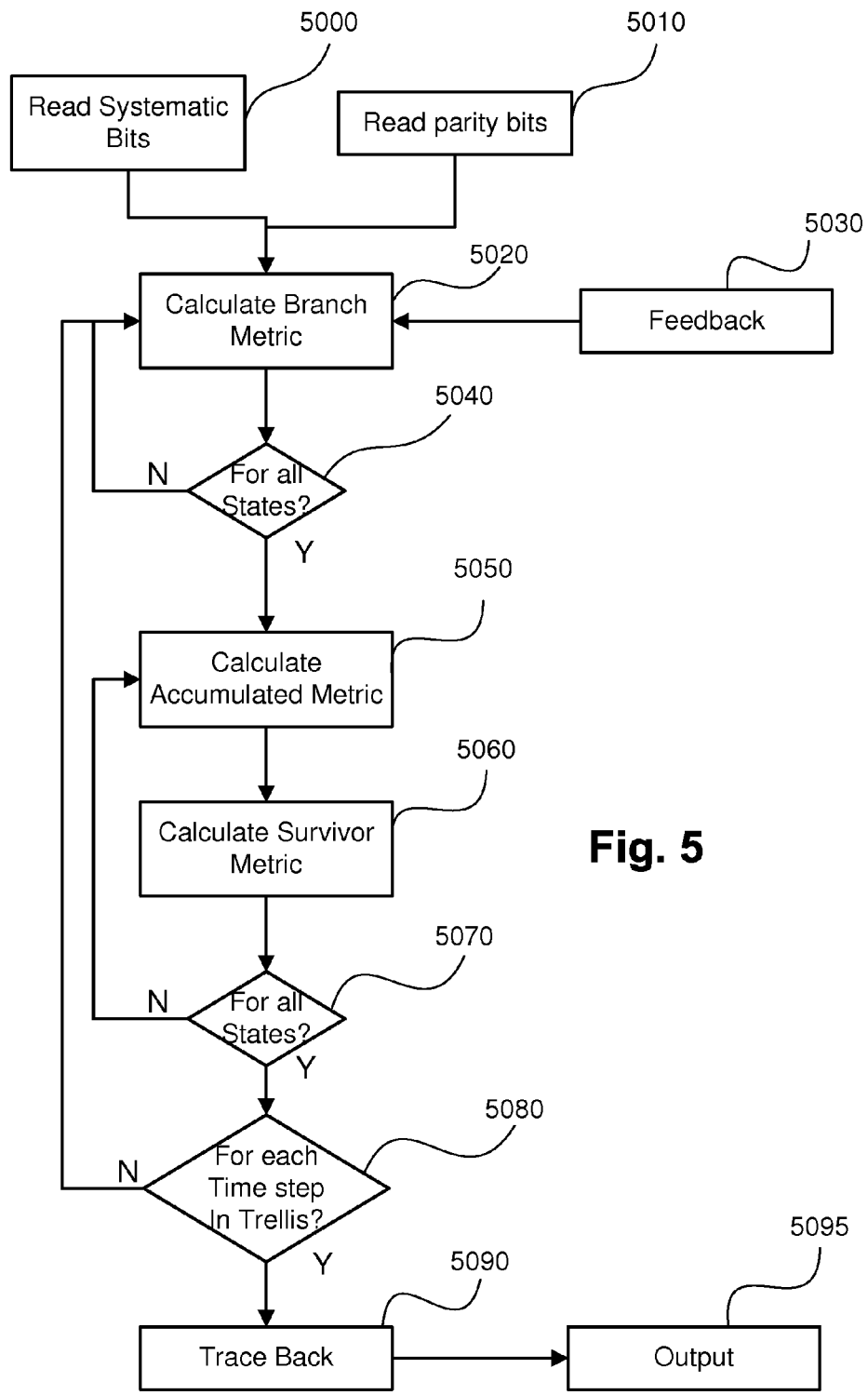
FIG. 5 shows a schematic flow diagram of a process performed in a component decoder of the turbo decoder of FIG. 3.

The component decoder 3060 is now described in more detail with reference to FIG. 5 where a schematic flow diagram of the process performed by the component decoder 3060 is shown. The process of FIG. 5 may be implemented in software by instructions executable by the processor 6005, or by a specific hardware implementation. As mentioned above, the two component decoders 3060 and 3070 need not be identical. However, in a preferred implementation the component decoders 3060 and 3070 are identical. The component decoder 3060 commences operation by reading the systematic bits 3010 (FIG. 3) in step 5000. As noted above, the systematic bits 3010 are the output of the bit plane extractor 1280. In step 5010 the parity bits 3020 (FIG. 3) are read. Processing continues in step 5020 where the so-called branch metric is computed, with the branch metric being well known in the art. The branch metric is a measure for the decoding quality for the current code word. The branch metric is zero if the decoding of the current code word is error free. Code word decoding errors can sometimes not be avoided and can still result in an overall optimal result.

The computation of the branch metric is performed by obtaining feedback 5030 from the other component decoder 3070 (FIG. 3) in the form of the log likelihood ratios as already described above. The log likelihood ratios, and as such the calculation of the branch metrics, is based on a model of the noise to be expected on the systematic bits 3010 (FIG. 3). Desirably, the Laplace noise model is employed to compensate for errors in the systematic bits 3010.

The noise to be expected on the systematic bits 3010 originates from the intraframe compression and the down and up-sampling. Modelling this noise is generally difficult as reconstruction noise is generally signal dependent (e.g. Gibbs phenomenon) and spatially correlated (e.g. blocking artifacts). This means that, in general, the errors are not independently, identically distributed. Channel coding techniques, e.g. turbo codes, assume independent, identically distributed noise.

Even though the magnitude of unquantized DC coefficients of the DCT coefficients formed by intraframe coding are generally Gaussian distributed, it has been recognised that the magnitude of unquantized AC coefficients are best described by a Laplacian distribution. Thus, the quantizing of the coefficients decreases the standard variation of those Laplacian distributions. This means that noise on DC coefficients may be modelled as Gaussian noise, and the noise on AC coefficients may be modelled as Laplace noise. Channel coding techniques, e.g. turbo codes, make the assumption that the noise is additive Gaussian white noise. It is thus disadvantageous to employ unmodified channel coding techniques.

As is evident from FIG. 1, the systematic bits used in the computation of the branch metric in step 5020 originate from a spatial prediction process through the upsampling performed in the sampler 1250.

Referring again to FIG. 5, it is next determined in step 5040 whether all states of a trellis diagram have been processed. If all states have not been processed, then processing returns to step 5020. If it is determined in step 5040 that the branch metrics for all states have been calculated, processing continues to step 5050 where the accumulated metric is computed. The accumulated metric represents the sum of previous code word decoding errors, which is the sum of previous branch metrics.

In step 5060 the so-called survivor path metrics are calculated. This survivor path metric represents the lowest overall sum of previous branch metrics, indicating what is the optimal decoding up to date.

Next, in step 5070 it is determined whether all states have been processed. If states remain for processing, then processing within the component decoder 3060 returns to step 5050. Once the computation of the branch metrics, the calculation of the accumulated metric and the calculation of the survivor path metrics is completed processing continue for a next time step in the trellis diagram in step 5080. Once the survivor metric is calculated for all nodes in the trellis diagram, trace back is calculated in step 5090. The trace back operation uses the obtained knowledge, being the branch metrics, the accumulated metric and the survivour path metrics, of which is the best decoding metric (indicating the decoding quality) to generate the decoded bit stream. The output of step 5090 is the final output 5095 of the component decoder 3060. This completes the detailed description of the turbo decoder 1260.

Figure 6:
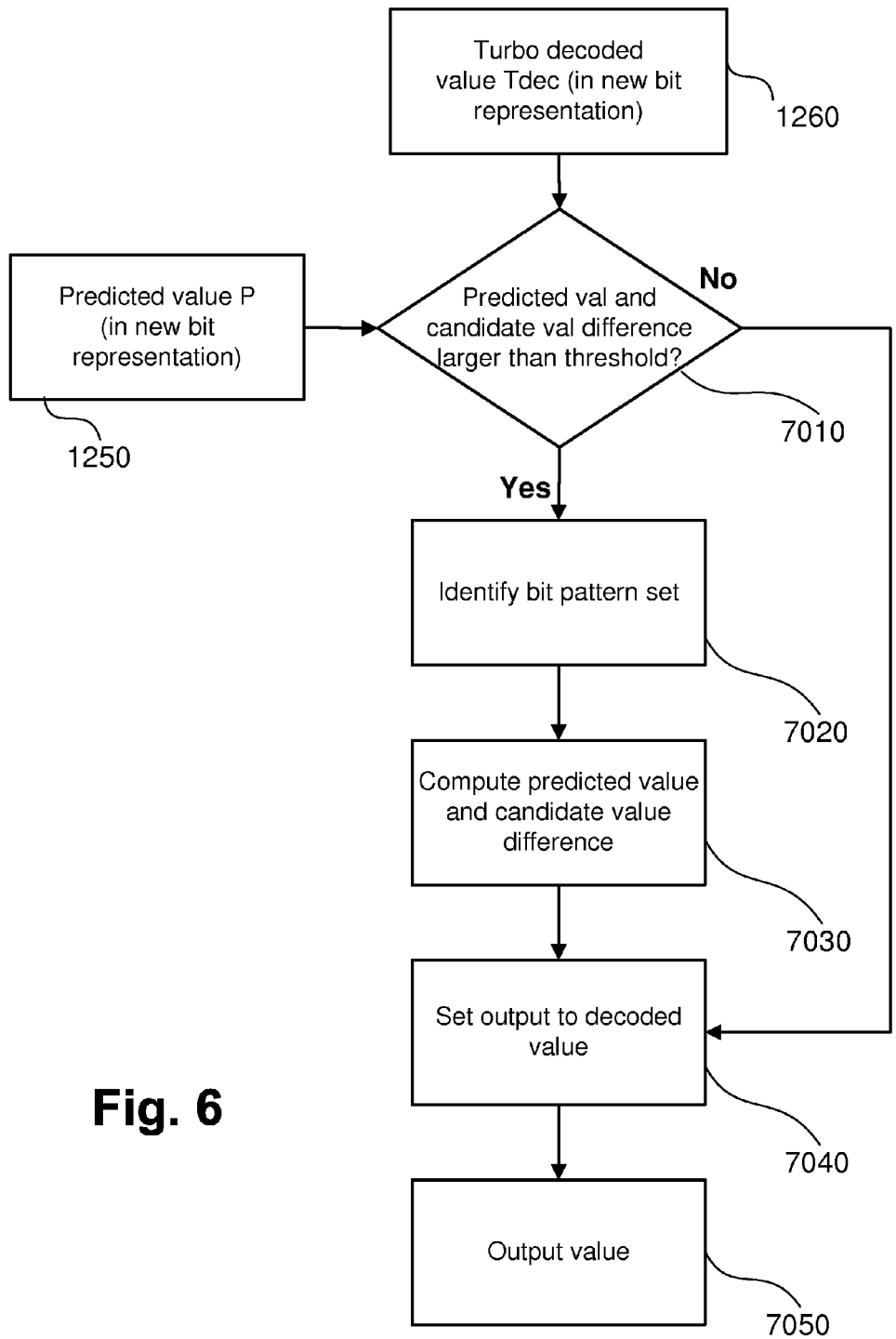
FIG. 6 shows a schematic flow diagram of the operation within a frame reconstruction module of the systems of FIG. 1.

Frame reconstruction module 1290 is next described in more detail with reference to the schematic flow diagram of FIG. 6 showing the operations performed by the frame reconstruction module 1290. Again the module 1290 may operate in software or hardware. Operation in the frame reconstruction module 1290 starts in step 7010 where it is determined whether the arithmetic difference between the predicted value from module 1255 and the decoded value from turbo decoder 1260 is below a certain threshold. If it is determined in step 7010 that the arithmetic difference is below that threshold (i.e., the difference is negligible), then processing continues to step 7040 where the output value 7050 is set to the decoded value transformed back to a conventional integer mapping (e.g., 0=000, 1=001, 2=010 and so on) using the inverse of the mapping performed by modules 1007 and 1255.

Alternatively, if it is determined in step 7010 that the arithmetic difference is greater than the threshold then, in step 7020, the frame reconstruction module 1290 identifies a set of bit patterns comprising bit patterns which have only a small number of bits different from the decoded value. The bit patterns in the set are considered candidate values. Next, in step 7030, the arithmetic difference between the predicted value and each of the candidate values is computed. The candidate value with the smallest difference is then selected and in step 7040 the output value 7050 is set to that candidate value transformed back to the conventional integer mapping using the inverse of the mapping performed by modules 1007 and 1255. In a preferred implementation, both the threshold value and the maximum number of bit differences equal 1. The process repeats until the frame is fully reconstructed.

Consider for example the 4-bit binary representation (Bit Pattern 1) shown in to FIG. 7B. Further, let the original pixel value obtained from the input frame 1005 be 7 and the predicted value from the up sampler 1250 be 8. The predicted value is already a good estimate of the original pixel value. In terms of the new binary representation formed by the module 1007, the original and the predicted values are represented by 0110 and 1000 respectively. Ideally, turbo coding should correct the three most significant bits and return 7 (0110 in binary) as the final decoded value. However, decoding errors are possible. For this example it is assumed that the second and the third most significant bits were modified correctly, but not the most significant bit. Thus the decoded value ends up as 2 (1110 in binary). The frame reconstruction module in step 7010 computes the arithmetic difference between the predicted value (8) and the decoded value (2). Since the absolute value of the difference is larger than the threshold value, which in the preferred implementation is 1, step 7020 identifies the most likely bit patterns which have only one bit difference from the decoded value (1110). Those bit patterns are 0110 (7), 1010 (11), 1100 (5), and 1111 (15). Step 7030 continues processing by computing the difference between the predicted value and each of the candidate values. The candidate value which gives the smallest difference is selected as the final output value. In the example above, the final output value is 7 (0110). Hence the original pixel value is recovered despite the fact that there are errors in both the prediction and the decoded value.

This concludes the detailed description of the frame reconstruction module 1290.

The process for generating a suitable new binary representation of length (bit depth) n is now described. The binary representation of length (bit depth) n is generated from binary-reflected Gray codes of length n−1. The Gray code of length n−1 is generated by the well known binary reflection which operates as follows:

Start with an initial Gray code of length 1, which is (0, 1). List that initial Gray code in reverse order, which results in (1, 0). Next, the initial Gray code and the reverse order listed code are concatenated, which results in (0, 1, 1, 0). The length of each codeword now gets increased: the initial Gray code gets the prefix 0 whereas the reverse listed code gets the prefix 1. This results in the code (00, 01, 11, 10) which is the binary-reflected Gray code of length n=2. This process is iterated until it results in a binary-reflected Gray code of length n−1.

Let this code be $(x_0, x_1, x_2, \ldots, x_{p-1})$. To derive the new binary representation of length n this binary-reflected Gray code of length n−1 is listed in reverse order and concatenated to the original code again.

This results in $(x_0, x_1, x_2, \ldots, x_{p-1}, x_{p-1}, x_{p-2}, \ldots, x_1, x_0)$. Next, every second codeword $x_{2j+1}$ for $j=2^{n-1}$ is bitwise complemented. This results in the sequence $(x_0, Cx_1, x_2, Cx_1, \ldots, Cx_{p-1}, x_{p-1}, Cx_{p-2}, \ldots, x_1, Cx_0)$, with $Cx_i$ representing the bitwise complement of codeword $x_i$. Next, the code gets an alternating prefix throughout the sequence which results in:

$(0x_0, 1Cx_1, 0x_2, 1Cx_1, \ldots, 1Cx_{p-1}, 0x_{p-1}, 1Cx_{p-2}, \ldots, 0x_1, 1Cx_0)$, which is the new binary representation of length n.

The above process is illustrated by way of example in Table 1, starting with an example of the generation of a new binary representation of length n=3.

TABLE 1

| Start<br>Binary reflective<br>Gray code (n − 1 = 2) | Step 1<br>Mirror | Step 2<br>Take complements | Step 3<br>Add<br>prefixes |
|---|---|---|---|
| 00 | 00 | 00 | 000 |
| 01 | 01 | 10 | 110 |
| 11 | 11 | 11 | 011 |
| 10 | 10 | 01 | 101 |
|  | 10 | 10 | 010 |
|  | 11 | 00 | 100 |
|  | 01 | 01 | 001 |
|  | 00 | 11 | 111 |

Table 2 below illustrates the process of a new binary representation of length n=4.

TABLE 2

| Start<br>Binary reflective<br>Gray code (n − 1 = 2) | Step 1<br>Mirror | Step 2<br>Take complements | Step 3<br>Add<br>prefixes |
|---|---|---|---|
| 000 | 000 | 000 | 0000 |
| 001 | 001 | 110 | 1110 |
| 011 | 011 | 011 | 0011 |
| 010 | 010 | 101 | 1101 |
| 110 | 110 | 110 | 0110 |
| 111 | 111 | 000 | 1000 |
| 101 | 101 | 101 | 0101 |
| 100 | 100 | 011 | 1011 |
|  | 100 | 100 | 0100 |
|  | 101 | 010 | 1010 |
|  | 111 | 111 | 0111 |
|  | 110 | 001 | 1001 |

TABLE 2-continued

| Start Binary reflective Gray code (n − 1 = 2) | Step 1 Mirror | Step 2 Take complements | Step 3 Add prefixes |
|---|---|---|---|
| | 010 | 010 | 0010 |
| | 011 | 100 | 1100 |
| | 001 | 001 | 0001 |
| | 000 | 111 | 1111 |

The foregoing describes only some embodiments of the present invention, and modifications and/or changes can be made thereto without departing from the scope and spirit of the invention, the embodiments being illustrative and not restrictive.

For example, instead of processing the same input video frame 1005 in order to produce the bitstreams 1110 and 1120, in an alternative implementation bitstream 1110 is formed from a key frame of the input video, whereas bitstream 1120 is formed from non-key frames. In such an arrangement the data output from up sampler 1250 is then an estimate of the non-key frames, and the turbo decoder 1260 uses the parity data from bitstream 1120 to correct the estimate.

In the context of this specification, the word "comprising" means "including principally but not necessarily solely" or "having" or "including", and not "consisting only of". Variations of the word "comprising", such as "comprise" and "comprises" have correspondingly varied meanings.

The invention claimed is:

1. A method of encoding video data, comprising the steps of:
   generating a first source of video data from a first set of video frames by approximating said video frames;
   generating a second source of video data from a second set of video frames by transforming first respective binary representations of pixel values of said second set of video frames into second respective binary representation of the pixel values of the second set of video frames according to a mapping such that Hamming distance between each of successive pixel values in a predetermined range of values in the second binary representation is greater than Hamming distance between each of successive pixel values in a predetermined range of values in the first binary representation; and
   encoding said first and second sources independently.

2. A method as claimed in claim 1, wherein said first and second sets of video frames have frames in common.

3. A method of decoding encoded video data from first and second sources of video data, said first source of video data comprising a first approximation of a first set of video frames and said second source of video data being formed by applying a mapping on pixel values of a second set of video frames, said mapping transforming first respective binary representations of pixel values in a predetermined range of values into second respective binary representations of the pixel values of the second set of video frames such that Hamming distance between each of successive pixel values in the second binary representation is greater than Hamming distance between each of successive pixel values in a predetermined range of values in the first binary representation, comprising the steps of:
   generating a second approximation of at least said first set of video frames from said first source of video data;
   transforming the first respective binary representations of pixel values of at least a portion of said second approximation of said first set of video frames into the second respective binary representation of the pixel values of at least the portion of said second approximation of said first set of video frames using said mapping;
   correcting the modified second binary representations of pixel values of said second approximation of said first set of video frames using the Hamming distances between the second binary representations of pixel values of said second approximation of said first set of video frames and the modified second binary representations of said second approximation of said first set of video frames; and
   applying the inverse of said mapping to the corrected binary representations.

4. A method according to claim 3, wherein said first approximation is formed by downsampling said first set of video frames, and said second approximation is formed by upsampling a third representation formed from said first representation.

5. A method of encoding and decoding video data, comprising the steps of:
   generating a first source of video data from a first set of video frames;
   generating a second source of video data from a second set of video frames by transforming first respective binary representations of pixel values of said second set of video frames into second respective binary representation of the pixel values of the second set of video frames according to a mapping such that Hamming distance between each of successive pixel values in a predetermined range of values in the second binary representation is greater than Hamming distance between each of successive pixel values in a predetermined range of values in the first binary representation;
   transforming the first respective binary representations of pixel values of said first set of video frames into the second respective binary representation of the pixel values of said first set of video frames using said mapping;
   modifying the second respective binary representations of pixel values of said first set of video frames using the second respective binary representations of the pixel values of the second set of video frames;
   correcting the improved second binary representations of pixel values of said first set of video frames using the Hamming distances between the second binary representations of pixel values of said first set of video frames and the modified second binary representations of said first set of video frames; and
   applying the inverse of said mapping to corrected binary representations.

6. A method of coding video data, comprising the steps of:
   transforming first bit representations in a predetermined range of component values of pixels of said video data into second respective bit representation of the pixel values of the second set of video frames, wherein the Hamming distance of each of successive pixel values in the second bit representations is increased to at least two.

7. An encoder for encoding video data, comprising:
   a device to generate video data from video frames by transforming first respective binary representations of pixel values of the video frames into second respective binary representation of the pixel values of the video frames according to a mapping such that Hamming distance between each of successive pixel values in a predetermined range of values in the second binary representation is greater than Hamming distance between each of successive pixel values in a predetermined range of values in the first binary representation; and a device to encode said generated video data.

8. The decoder according to claim 7, comprising:

a device to generate a prediction of the video data in the second binary representation;

a device to modify the prediction with the encoded video data;

a device to correct the modified prediction in the second binary representation the Hamming distances between the prediction in the second binary representations before the modification and the modified prediction in the second binary representation; and device to applying the inverse of said mapping to the corrected predictions.

9. A method according to claim 6, comprising the steps of:

generating a prediction of the video data in the second binary representation;

modifying the prediction with the encoded video data; and correcting the modified prediction in the second binary representation using the Hamming distance between the prediction in the second binary representation before the modification and the modified prediction in the second binary representation.

10. A method according to claim 9, wherein the correcting step comprises the steps of:

checking arithmetic difference between the prediction in the second binary representation before the modification and the modified prediction;

identifying candidate values which have the smallest Hamming difference from the modified prediction if the arithmetic difference is larger than a predetermined threshold; and selecting a value as the corrected prediction from the candidate values, the value to be selected being the smallest arithmetic difference from the modified prediction.

11. A non-transitory computer readable storage medium having a computer program recorded therein, the program being executable by a computer apparatus so as to make the computer perform a method of coding video data, said method comprising the steps of:

transforming first bit representations in a predetermined range of component values of pixels of said video data into second respective bit representation of the pixel values of the second set of video frames, wherein the Hamming distance of each of successive pixel values in the second bit representations is increased to at least two.

12. A non-transitory computer readable storage medium according to claim 11, wherein the method comprises the steps of:

generating a prediction of the video data in the second binary representation;

modifying the prediction with the encoded video data; and correcting the modified prediction in the second binary representation using the Hamming distance between the prediction in the second binary representation before the modification and the modified prediction in the second binary representation.

* * * * *